(12) United States Patent  (10) Patent No.: US 8,619,915 B2
Yamamoto  (45) Date of Patent: Dec. 31, 2013

(54) RECEIVER

(75) Inventor: Takuji Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 157 days.

(21) Appl. No.: 12/972,209

(22) Filed: Dec. 17, 2010

(65) Prior Publication Data

US 2011/0085621 A1  Apr. 14, 2011

Related U.S. Application Data

(63) Continuation of application No. PCT/JP2008/001591, filed on Jun. 20, 2008.

(51) Int. Cl.
*H04L 25/06* (2006.01)

(52) U.S. Cl.
USPC .......................... 375/318; 375/316; 455/130

(58) Field of Classification Search
USPC ........................................................ 375/318
See application file for complete search history.

(56) References Cited

U.S. PATENT DOCUMENTS

| | | | | |
|---|---|---|---|---|
| 5,161,173 A * | 11/1992 | Nordby | ........................ | 375/373 |
| 5,545,977 A * | 8/1996 | Yamada et al. | ............... | 323/313 |
| 6,011,435 A | 1/2000 | Takeyabu et al. | | |
| 6,763,477 B1 * | 7/2004 | McGee | ........................ | 713/600 |
| 6,829,188 B2 * | 12/2004 | Baker | ........................ | 365/205 |
| 7,352,219 B2 * | 4/2008 | Minzoni | ........................ | 327/175 |
| 7,379,401 B2 * | 5/2008 | Wu et al. | ...................... | 369/47.3 |
| 7,496,155 B1 * | 2/2009 | Lu et al. | ........................ | 375/326 |
| 7,525,358 B1 * | 4/2009 | Taft et al. | ...................... | 327/175 |
| 7,526,023 B1 * | 4/2009 | Shumarayev | .................. | 375/233 |
| 7,733,999 B2 * | 6/2010 | Mateosky et al. | ............. | 375/373 |
| 7,787,526 B2 * | 8/2010 | McGee | .......................... | 375/219 |
| 7,853,836 B2 * | 12/2010 | Takada | .......................... | 714/700 |
| 7,953,162 B2 * | 5/2011 | Shetty | ............................ | 375/257 |
| 8,000,412 B1 * | 8/2011 | Loinaz | ........................... | 375/330 |
| 8,037,338 B2 * | 10/2011 | Lee | ................ | 713/500 |
| 8,054,908 B2 * | 11/2011 | Nakasha et al. | ............... | 375/295 |
| 2002/0034266 A1 * | 3/2002 | Akahori | ......................... | 375/331 |
| 2002/0048328 A1 * | 4/2002 | Akahori | ......................... | 375/340 |
| 2003/0122610 A1 * | 7/2003 | Zeng et al. | .................... | 327/536 |
| 2004/0052323 A1 * | 3/2004 | Zhang | .......................... | 375/375 |
| 2004/0109398 A1 * | 6/2004 | Wu et al. | ..................... | 369/47.3 |

(Continued)

FOREIGN PATENT DOCUMENTS

JP  05-218773 A  8/1993
JP  09-331363 A  12/1997

(Continued)

*Primary Examiner* — Chieh M Fan
*Assistant Examiner* — Santiago Garcia
(74) *Attorney, Agent, or Firm* — Arent Fox LLP

(57) ABSTRACT

A receiver includes: a first amplifier for amplifying an input signal and outputting an output signal; a clock generator for generating a clock signal corresponding to a period of the output signal; a judger for outputting a first logical value or a second logical value in accordance with a phase lead or phase lag which has been occurred at a crossing point of the positive-phase signal and the negative-phase signal of the output signal upon rising or falling the clock signal; a detector for outputting a difference value between a time for which the judgment signal has the first logical value and a time for which the judgment signal has the second logical value; and an adjustor for adjusting reference voltages of a positive-phase signal and a negative-phase signal of the input signal in accordance with the difference value output from the detector.

7 Claims, 10 Drawing Sheets

(56) References Cited

U.S. PATENT DOCUMENTS

| | | | |
|---|---|---|---|
| 2005/0108600 A1* | 5/2005 | Arguelles | 714/701 |
| 2005/0275468 A1* | 12/2005 | Kakiuchi et al. | 331/16 |
| 2006/0103479 A1* | 5/2006 | Paillet et al. | 331/57 |
| 2007/0014340 A1* | 1/2007 | McGee | 375/220 |
| 2007/0046351 A1* | 3/2007 | Minzoni | 327/175 |
| 2007/0285139 A1* | 12/2007 | Heyne | 327/175 |
| 2008/0112712 A1* | 5/2008 | Inoue | 398/208 |
| 2008/0123792 A1* | 5/2008 | Prete et al. | 375/362 |
| 2010/0067633 A1* | 3/2010 | Den Besten | 375/373 |
| 2010/0091921 A1* | 4/2010 | Den Besten et al. | 375/354 |

FOREIGN PATENT DOCUMENTS

| | | |
|---|---|---|
| JP | 10-243040 A | 9/1998 |
| JP | 10-341261 A | 12/1998 |
| JP | 2002-158719 A | 5/2002 |
| JP | 2002-305447 A | 10/2002 |
| JP | 2008-099017 A | 4/2008 |

* cited by examiner

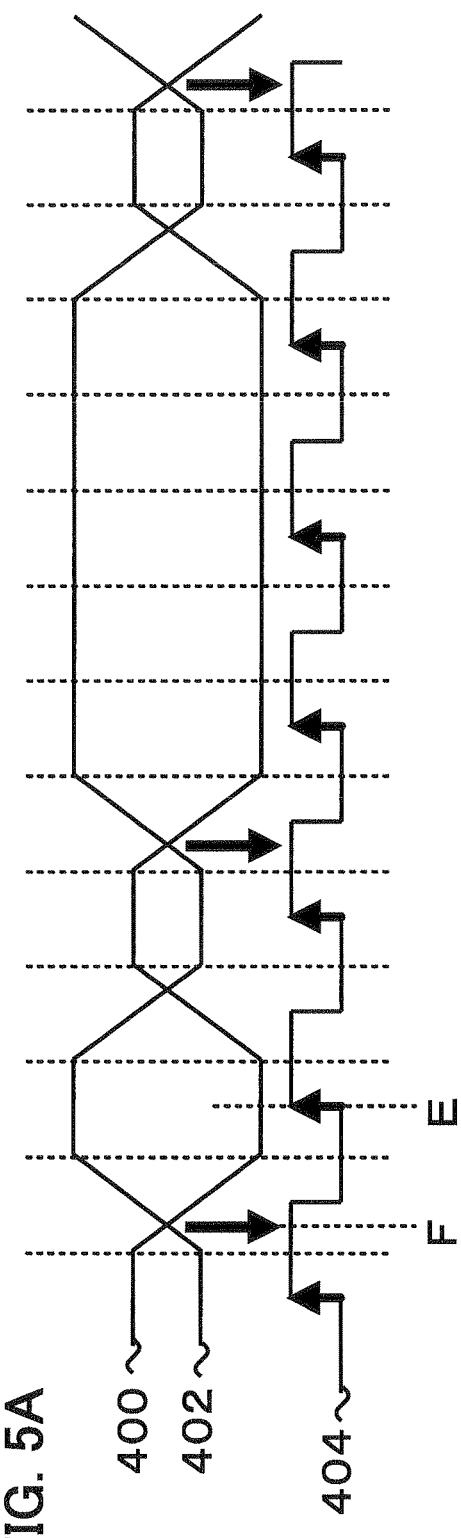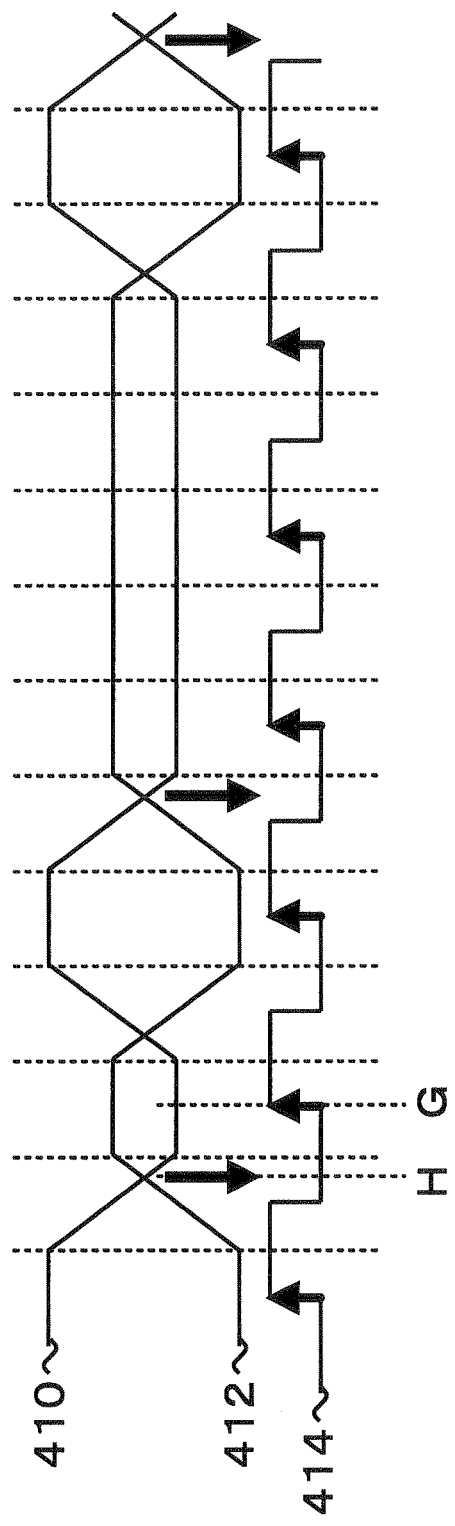
FIG. 5A
FIG. 5B

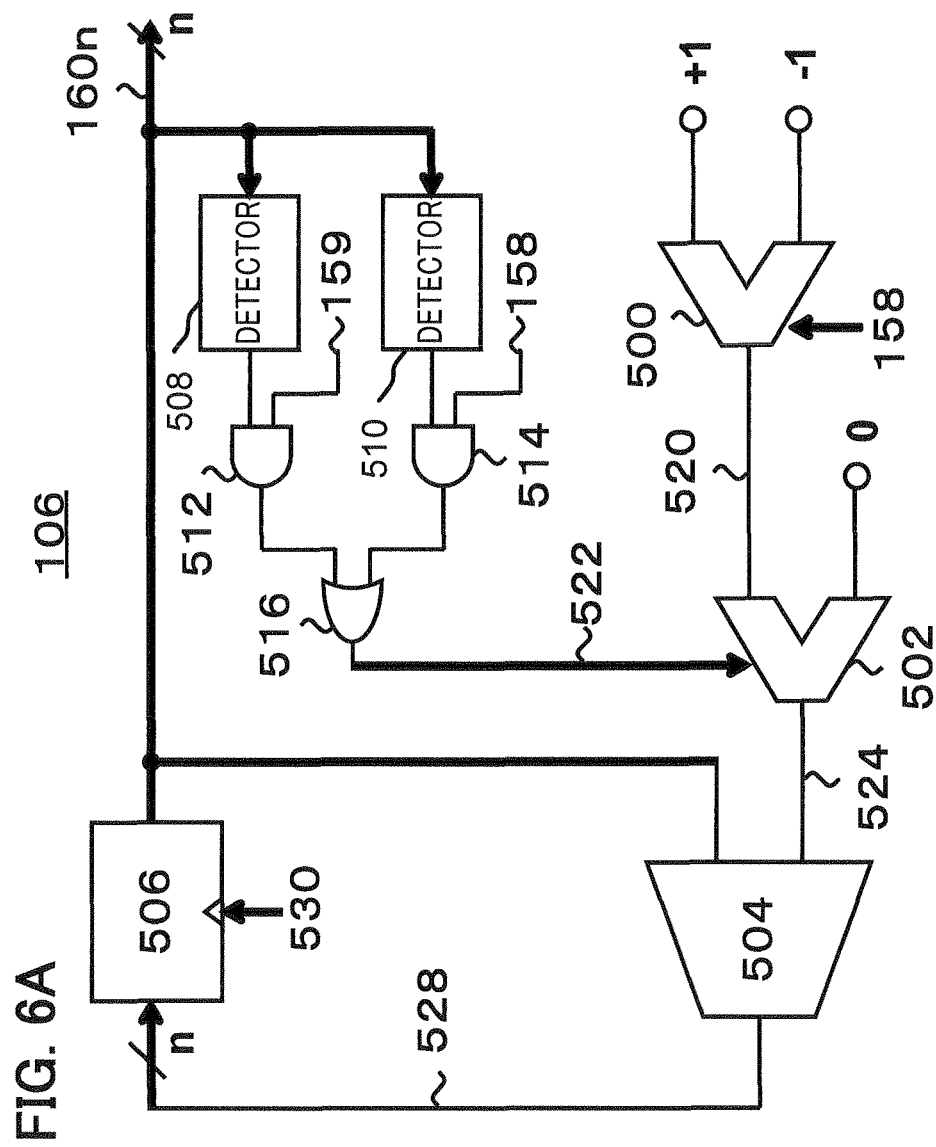

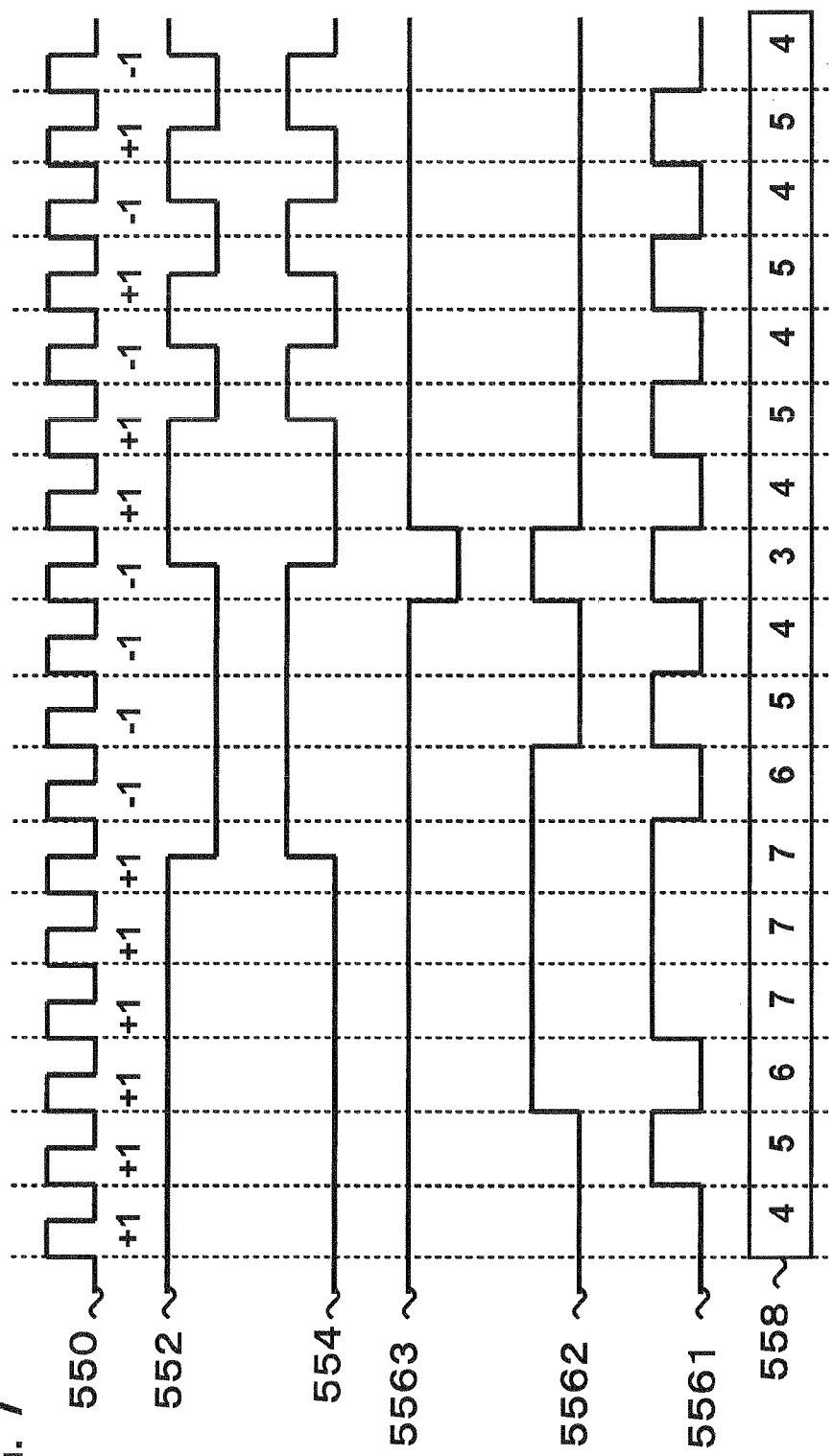

RECEIVER

CROSS-REFERENCE TO RELATED APPLICATION

This is a continuation of Application PCT/JP2008/001591, filed on Jun. 20, 2008, the entire contents of which are incorporated herein by reference.

FIELD

The embodiments discussed herein are related to a receiver that receives differential data signals.

BACKGROUND

In high-speed transmission of digital signals, differential signal transmission is generally performed. In some cases, the amplitude of the differential signal is very small. Thus, in a receiver that receives the differential signal, the signal is amplified using an amplifier and then the logical value thereof is identified using a clock signal which is generated using a clock generator. As the clock generator, for example, a clock data recovery (CDR) is used. The CDR generates a clock signal on the basis of a differential data signal which has been input into the CDR and identifies the logical value of the differential data signal at a timing that the clock signal rises or falls.

The logical value of a differential signal is identified by obtaining the value of a difference between the voltage value of one differential signal which is defined as a reference value and that of another differential signal. If the reference voltage of another differential signal deviates from the reference voltage of one differential signal owing to variations in manufacture of elements of amplifiers, a timing at which a difference value which is favorable and sufficient for identification of the logical value of the differential signal is not obtained will be generated and hence correct identification of the logical value of the differential signal will become difficult. Incidentally, the reference voltage means a central value of amplitudes of the voltage of each of the differential signals and a difference in the reference voltage between the differential signals is referred to as an offset.

A technique for increasing the degree of identification performed using a clock generator by adding an offset compensator that adjusts the reference voltage of an output signal from an amplifier such that maximum amplitude values of a positive-phase component and a negative-phase component of a differential signal become the same as each other is proposed, for examples, as disclosed in Japanese Laid-open Patent Publication No. 05-218773. In the above mentioned technique, the offset compensator is an analog circuit. The analog circuit may be influenced by noise such as noise generated from a power source. If the offset compensator is influenced by the noise, difference will occur in the adjusting amounts of reference voltages.

SUMMARY

According to an aspect of the embodiment, a receiver includes: a first amplifier for amplifying an input differential data signal and outputting an output differential data signal; a clock generator for generating a differential clock signal corresponding to a period of the output differential data signal on the basis of a positive-phase component signal and a negative-phase component signal of the output differential data signal; a judger for outputting a first logical value or a second logical value as a judgment signal in accordance with a phase lead or phase lag which has been occurred at a crossing point of the positive-phase component signal and the negative-phase component signal of the output differential data signal upon rising or falling of the differential clock signal; a detector for outputting a value of a difference between a time for which the judgment signal has the first logical value and a time for which the judgment signal has the second logical value as a detection signal; and an adjustor for adjusting reference voltages of a positive-phase component signal and a negative-phase component signal of the input differential data signal in accordance with the detection signal.

The object and advantages of the embodiment will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5A is a diagram illustrating an example of waveforms of a differential data signal and a clock signal which are input into the judger;

FIG. 5B is a diagram illustrating an example of waveforms of a differential data signal and a clock signal which are input into the judger;

FIG. 6A is a diagram illustrating an example of a configuration of a detector;

FIG. 6B is a diagram illustrating an example of a truth table;

FIG. 6C is a diagram illustrating an example of a truth table;

FIG. 7 is a diagram illustrating an example of a timing chart of the detector;

DESCRIPTION OF EMBODIMENTS

Next, preferred embodiments of the present invention will be described with reference to the accompanying drawings.

Figure 1:
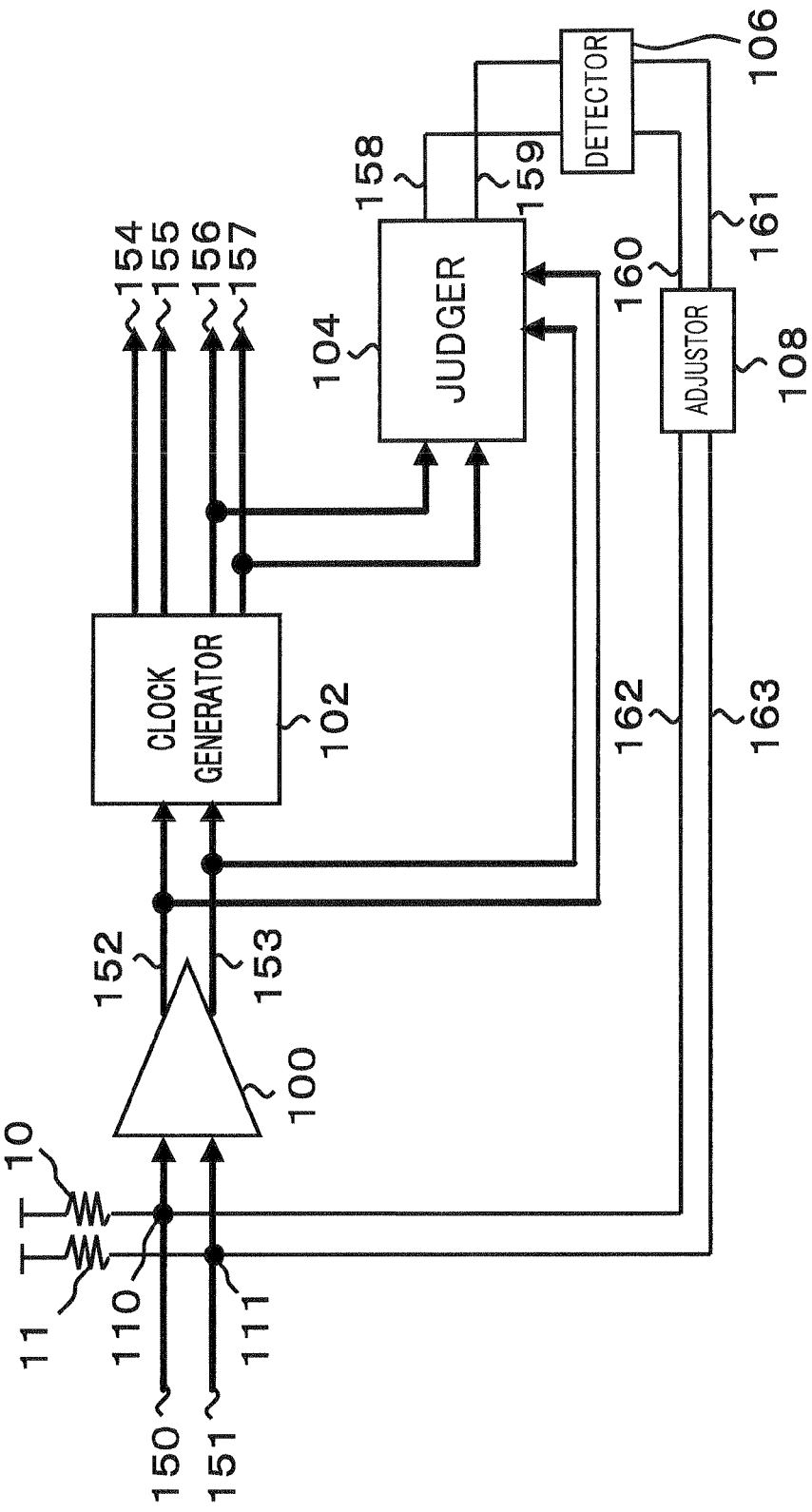
FIG. 1 is a block diagram illustrating an example of a receiver.

FIG. 1 is a block diagram illustrating an example of a receiver according to an embodiment. The receiver includes an amplifier 100, a clock generator 102, a judger 104, a detector 106, and an adjustor 108. An adjusting circuit includes the detector 106 and the adjustor 108.

The amplifier 100 amplifies the voltage of a differential data signal which has been input into the amplifier. The differential data signal includes data signals 150 and 151. The amplifier 100 outputs a differential data signal including data signals 152 and 153. The differential signal includes a positive-phase component signal and a negative-phase component signal which are out of phase with each other.

The clock generator 102 generates a positive-phase component signal and a negative-phase component signal included in a differential clock signal. The differential clock signal is output corresponding to a period in which the differential data signal is output on the basis of the positive-phase component signal and the negative-phase component signal of the differential data signal. In the example of the embodiment illustrated in FIG. 1, the clock generator 102 generates a differential clock signal. The differential clock signal is a basic clock signal used for transmission of a differential data signal. The differential clock signal includes clock signals 156 and 157 having a duty ratio of 50% on the basis of the differential data signal including the data signals 152 and 153. Signals 154 and 155 constitute a differential data signal which is generated in synchronization with the differential clock signal including the clock signals 156 and 157.

The judger 104 outputs a logical value which is set high or low in accordance with a lead or lag in the phase of the differential data signal at a crossing point of the data signals 152 and 153 of the differential data signal relative to rise or fall of the clock signal 156. The clock signal 156 is the positive-phase component signal of the differential clock signal which has been generated using the clock generator 102 as a judgment signal. Incidentally, the crossing point is a timing at which a relation in magnitude between the voltage values of the signals 152 and 153 is reversed. In the example of the embodiment illustrated in the drawing, the judger 104 keeps outputting a logical value "1" when the differential data signal leads in phase the clock signal 156 which falls, at the crossing point of the data signals 152 and 53 or a logical value "0" when the differential data signal lags in phase the clock signal 156 which falls, at the crossing point of the data signals 152 and 153 as a judgment signal 158. A judgment signal 159 is a negative-phase component signal of the judgment signal 158. In the example of the embodiment illustrated in the drawing, whether the differential data signal leads or lags in phase is judged on the basis of the fall of the clock signal 156 (that is, whether the differential data signal leads or lags in phase the clock signal 156 which falls is judged). As an alternative, the judger 104 may be designed to perform judgment on the basis of the clock signal 156 which rises. That is, for example, judgment on the basis of the clock signal which rises may become possible by reversing the amplitude of the clock signal 156 input into the judger 104.

The detector 106 periodically counts times for which the judgment signals 158 and 159 which are sent from the judger 104 are held high and low and outputs values of differences between times for which the judgment signals are held high and low as detection signals 160 and 161. More specifically, for example, the detector 106 counts the time for which a logical signal "1" or "0" is output from the judger 104 as the judgment signal 158 in a fixed period to determine the count value. Owing to the above mentioned operation, the time for which the differential data signal leads or lags in phase the clock signal may be converted to a digital value which is called the count value. The detector 106 outputs the count values so determined as detection signals 160 and 161.

The adjustor 108 adjusts reference voltages of the positive-phase component signal 150 and the negative-phase component signal 151 of the differential data signal in accordance with the detection signals 160 and 161 which have been input into the adjustor 108. The adjustor 108 is connected to connection points 110 and 111 via wirings 162 and 163. By connecting the adjustor 108 to the connection points, currents flowing through resistors 10 and 11 are increased to decrease the reference voltage of the differential data signal including the data signals 150 and 151. As a result, the phase of the differential data signal at a crossing point between the data signals 150 and 151 is changed accordingly.

The amplifier 100 performs impedance-separation on the differential data signal including the data signals 150 and 151 and the differential data signal including the data signals 152 and 153. Owing to the above mentioned operation, influence of input impedances of the clock generator 102, the judger 104 and the like which are connected to the output side of the amplifier 100 on the operation of the adjustor 108 may be eliminated and hence the accuracy that the adjuster 108 adjusts the reference voltages of the data signals 150 and 151 may be increased.

According to the example of the above mentioned receiver, the reference voltage may be adjusted on the basis of the digital signal which is output from the detector 106. With the use of the digital signal in adjustment, it may become possible to decrease variations in the reference voltage adjusting amounts which would occur with the use of an analog circuit in adjustment of the reference voltage.

Figure 2:
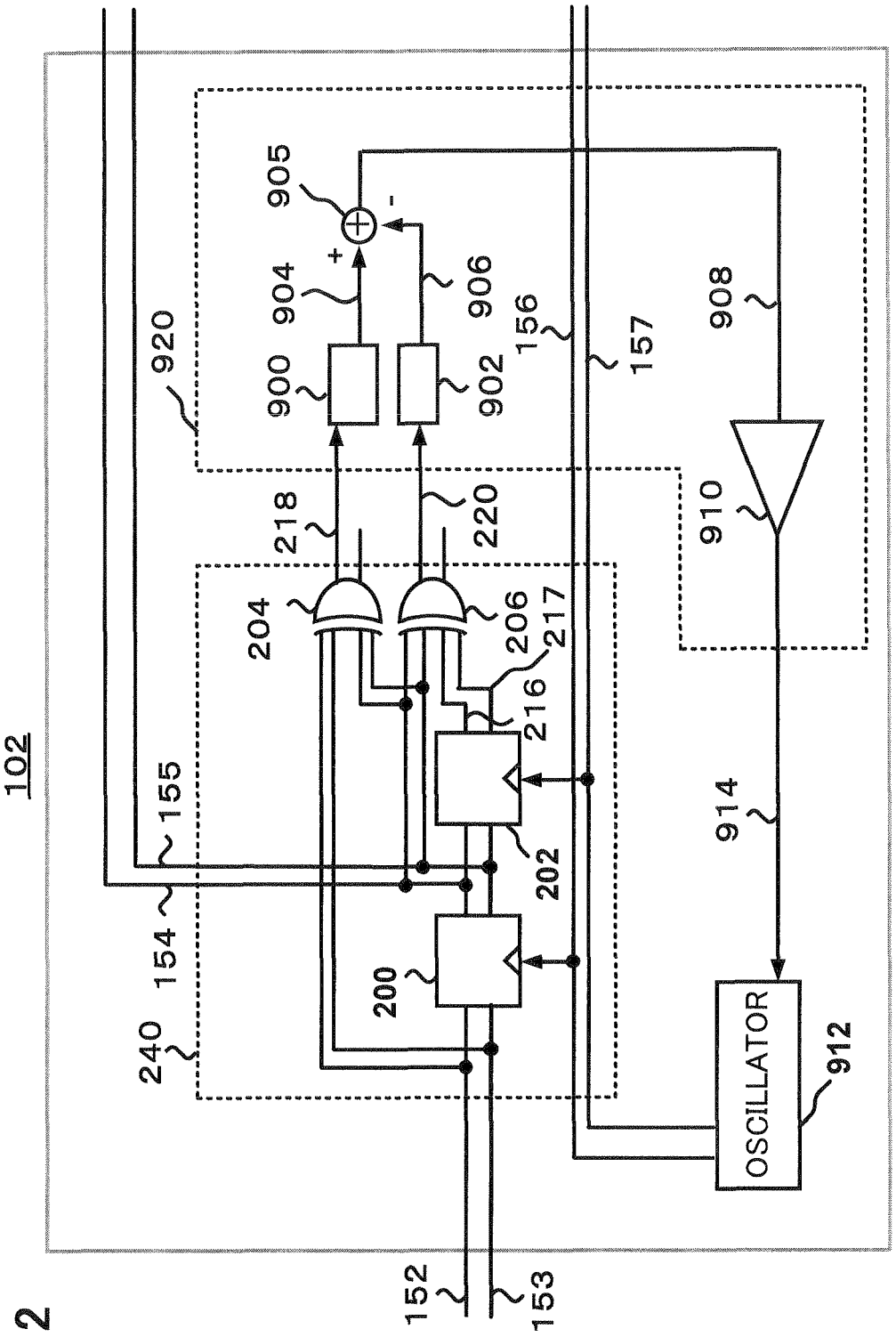
FIG. 2 is a block diagram illustrating an example of a clock generator.

FIG. 2 is a block diagram illustrating an example of the clock generator 102. The clock generator 102 includes a phase detector 240, a feedback controller 920, and an oscillator 912. The clock generator 102 generates the differential clock signal including the clock signals 156 and 157 on the basis of the input differential data signal including the data signals 152 and 153. Then, the clock generator 102 outputs the differential data signal which synchronizes with the differential clock signal including the clock signals 156 and 157 and includes the signals 154 and 155.

The phase detector 240 includes a register 200, a register 202, an XOR circuit 204, and an XOR circuit 206. In the example of the embodiment illustrated in the drawing, as the phase detector 240, a phase digital converter which is called a Hogee's phase detector is used. The phase detector 240 outputs a signal 220 having a pulse width corresponding to a half period of the clock signal 156 and a signal 218 having a pulse width corresponding to a shift in rise timing between the clock signal 156 and the data signal 152.

The register 200 receives the differential data signal including the data signals 152 and 153 as the input signal and outputs the differential signal including the signals 154 and 155 at a timing that the clock signal 156 which has been generated within the clock generator 102 is shifted to a logical value "1".

The register 202 receives the differential data signal including the signals 154 and 155 as the input signal and outputs a differential signal including signals 216 and 217 at a timing that the logical value of the clock signal 157 shifts to "1".

The XOR circuit 204 receives the differential signal including the signals 152 and 153 and the differential data signal including the signals 154 and 155 as the input signals and outputs a signal 218 which is a positive-phase component of a signal obtained by performing an exclusive-OR operation on the input signals. The XOR circuit 206 receives the differential signal including the signals 154 and 155 and the differential data signal including the signals 216 and 216 as the input signals and outputs a signal 220 which is a positive-phase component of a signal obtained by performing an exclusive-OR operation on the input signals. The output signals from the XOR circuits 204 and 206 are differential signals and only one of the component signals in each of the differential signals is input into the feedback unit 920.

The feedback unit 920 includes integrating circuits 900 and 902, an adder 905, and an amplifier 910. The feedback controller 920 receives the signals 218 and 220 as the input signals and outputs a signal 914. The feedback controller 920 converts a difference in pulse width between the signals 218 and 220 output from the phase detector 240 into a voltage value and outputs the voltage value so converted.

The integrating circuit 900 includes a capacitive element which is connected between the signal line of the signal 218 and the ground. The integrating circuit 900 charges a DC component of the signal 218 using the capacitive element and outputs a voltage value of the current component so charged as a signal 904. The integrating circuit 902 receives the signal 220 as the input signal, charges a DC component of the signal 220 and outputs a voltage value of the current component so charged as a signal 906.

The signal 220 has the same pulse width as the clock signal 156. Thus, the amplitude of the output signal 906 from the integrating circuit 902 changes in accordance with the frequency of the clock signal 156. On the other hand, the pulse width of the signal 218 is determined on the basis of a phase difference generated between the signal 152 and the clock signal 156 upon rising of the clock signal 156. Thus, the amplitude of the output signal 904 from the integrating circuit 900 changes in accordance with the phase difference between the signal 152 and the clock signal 156.

The adder 905 receives the signals 904 and 906 as the input signals and outputs a value of a difference in voltage amplitude between the signals 904 and 906 as a signal 908.

The amplifier 910 amplifies the difference signal 908 indicative of the value of the difference in voltage amplitude between the signals 905 and 906 and outputs a signal 914. The amplifier 910 may be configured to output a 0V-signal when the amplitude of the difference signal 908 is 0V or to output a constant voltage value.

The oscillator 912 receives the signal 914 as the input signal and outputs a differential clock signal including the clock signals 156 and 157 and having a frequency which is determined in accordance with the voltage amplitude of the signal 914. The oscillator 912 increases the clock frequency such that the pulse width of the signal 218 is reduced in the case that the value of the voltage amplitude of the signal 914 is positive, and reduces the clock frequency such that the pulse width of the signal 218 is increased in the case that the value of the voltage amplitude of the signal 914 is negative. The oscillator 912 also changes the phase of the differential clock signal including the clock signals 156 and 157 on the basis of the signal 914 in addition to changing of the frequency of the differential clock signal.

By performing feedback control as mentioned above, the clock frequency is determined such that the voltage amplitude of the signal 908 is reduced to 0V. When the voltage amplitude of the signal 908 is 0V, the pulse widths of the signals 218 and 220 are equal to each other. In the above mentioned situation, the basic clock signal on the basis of which the differential data signal including the data signals 156 and 157 is sent out and the differential clock signal including the clock signals 156 and 157 may have the same period.

In addition, the pulse widths of the signals 218 and 220 correspond to a half period of the clock signal 156. Thus, a timing at which the clock signal 156 is shifted to a logical value "1", that is, a timing at which the signal 152 is sampled comes after a half period of the clock signal 156 counting from when the signal 152 rises. Thus, the signal 152 may be preferably sampled using the clock signal 156.

Figure 3:
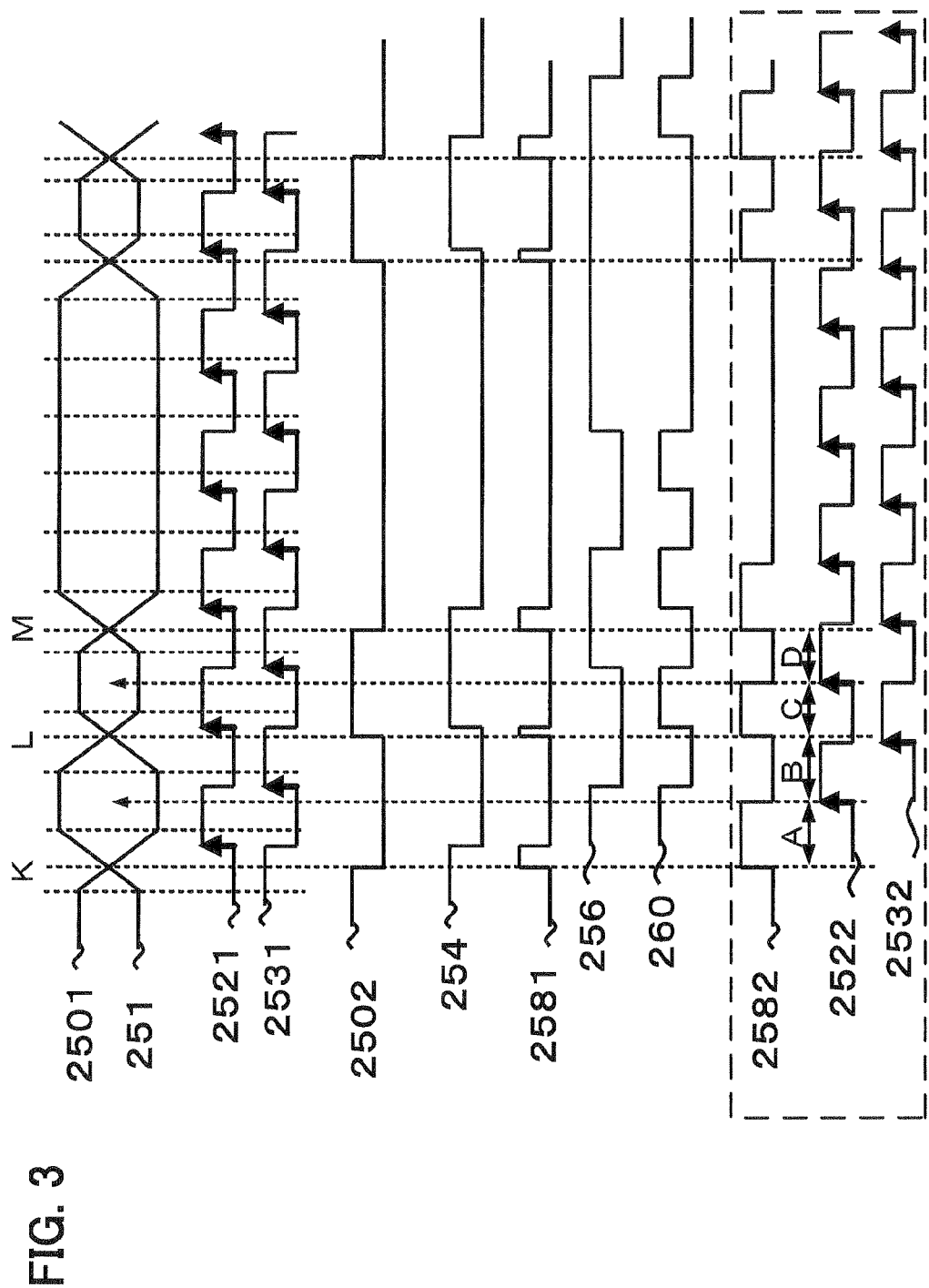
FIG. 3 is a diagram illustrating examples of operating waveforms of a phase detector.

FIG. 3 is a diagram illustrating examples of operating waveforms of the phase detector 240 included in the clock generator 102. Waveforms 2501 and 2502 are voltage waveforms of the signal 152. The waveform 2502 schematically illustrates that the level of the voltage is changed at a crossing point of the waveform 2511 and a waveform 251. The waveform 251 is a voltage waveform of the data signal 153.

Waveforms 2521 and 2522 are voltage waveforms of the clock signal 156. The waveform 2521 indicates an initial clock signal waveform obtained when extraction of the clock signal is started. The waveform 2522 indicates a clock signal waveform obtained when clock signal generation has been completed. Waveforms 2531 and 2532 are voltage waveforms of the clock signal 157.

A waveform 254 is a voltage waveform of the signal 154. A waveform 256 is a voltage waveform of the signal 216. Waveforms 2581 and 2582 are voltage waveforms of the signal 218. The waveform 2581 indicates the waveform of the signal 218 obtained when clock signal extraction is started. The waveform 2582 indicates the waveform of the signal 218 obtained when clock signal generation has been completed. A waveform 260 is a voltage waveform of the signal 220.

Comparison of the waveform 2581 with the waveform 260 indicates that pulses of the same number are generated in a fixed period. In addition, the pulse with of the waveform 2581 is equal to a delay time of the waveform 2521 relative to the waveform 2502. When the mean value of amplitudes of the waveform 2581 becomes equal to the mean value of amplitudes of the waveform 260 as indicated by the waveform 2582, the waveform 2582 falls at a timing that a time A and a time B become equal to each other and at a timing that a time C and a time D become equal to each other. The fall timing of the waveform 2582 is the same as the rise timing of the clock signal, so that the clock signal waveform rises at an intermediate point between crossing points K and L or L and M as indicated by the waveform 2522. Incidentally, in the example illustrated in FIG. 3, the crossing point is a timing at which the waveforms 2501 and 251 intersect each other.

Figure 4:
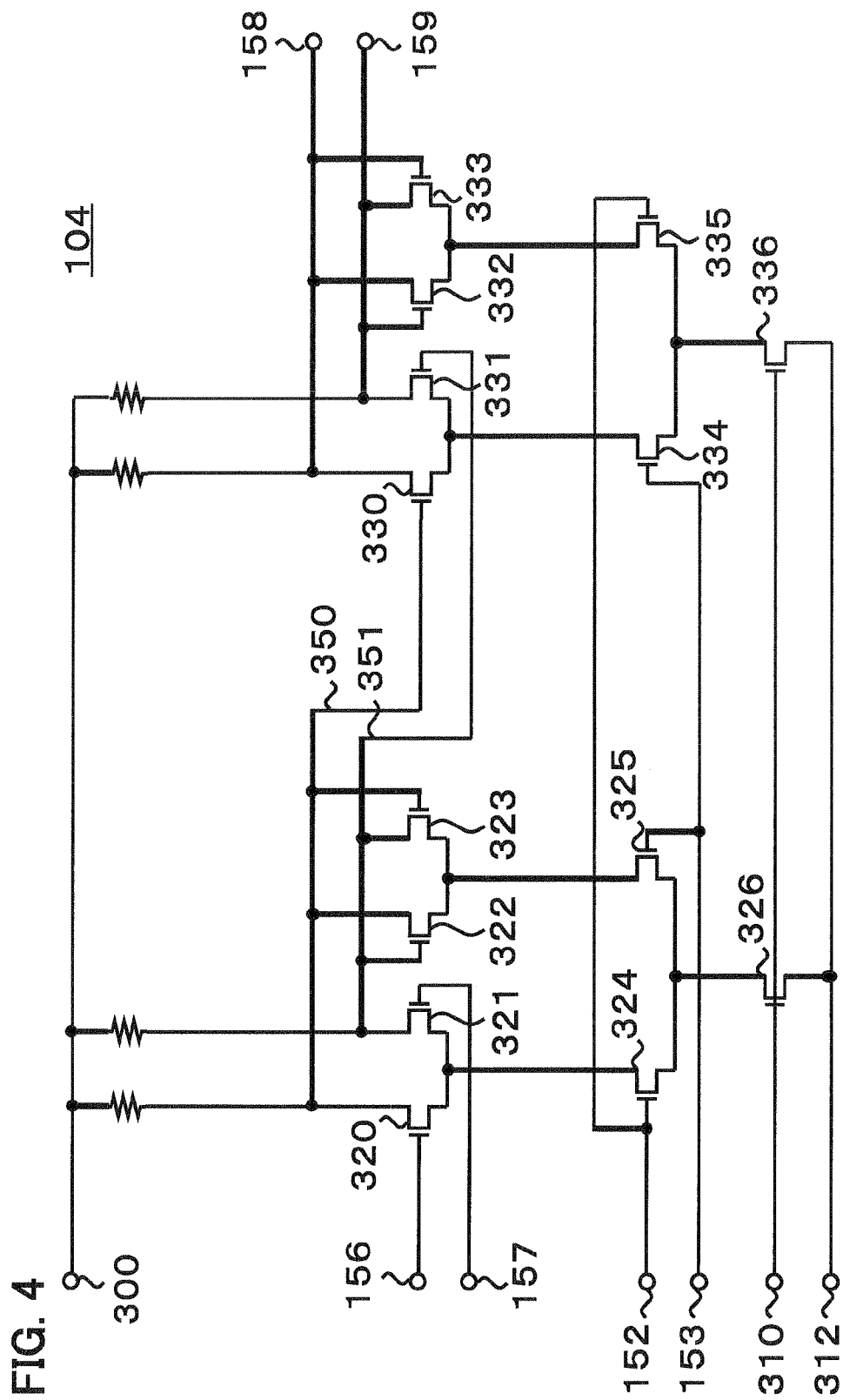
FIG. 4 is a diagram illustrating an example of a configuration of a judger.

FIG. 4 is a diagram illustrating an example of a configuration of the judger 104. In the example illustrated in FIG. 4, a master-slave type D flip flop is used as the judger 104. The judger 104 includes fourteen MOS transistors 320 to 333. The judger 104 keeps outputting a signal of a different logical value for a fixed term depending on whether the data signal leads or lags in phase the clock signal 126 which falls, at the crossing point, in phase changing which is generated at the crossing point owing to a deviation of the reference voltage of the data signal 152 or 153.

A positive supply voltage is supplied to a terminal 300 on the basis of the voltage supplied to a terminal 312 as a reference. A voltage used to determine current values of transistors 326 and 336 included in a current source in the flip flop is supplied to a terminal 310.

The transistors 320 and 321 constitute a differential amplifier circuit. When the data signal 152 which is set to a logical value "1" is input into the judger 104, the transistor 324 is turned on. In the above mentioned situation, it is assumed that the clock signal 156 has a logical value "1" and the clock signal 157 has a logical value "0". In the above mentioned case, the transistor 320 is turned on and the transistor 321 is turned off, so that a signal 350 is shifted to a logical value "0" and a signal 351 is shifted to a logical value "1".

The transistors 322 and 323 constitute a positive feedback loop. When the signal 152 is shifted from a logical value "1" to a logical value "0" and the signal 153 is shifted from a logical value "0" to a logical value "1", the transistor 324 is turned off and the transistor 325 is turned on. In the above mentioned situation, the logical levels of the signals 350 and 351 are held in the transistors 322 and 323.

The transistors 330 and 331 constitute a differential amplifier circuit. It is assumed that a transistor 334 is in ON state. In the above mentioned situation, the signal 153 has a logical value "1", the signal 350 has a logical value "0" and the signal 351 has a logical value "1", so that a signal of a logical value "1" is output to a terminal 158 and a signal of a logical value "0" is output to a terminal 159.

The transistors 332 and 333 constitute a positive feedback loop. In the case that the signal 153 is shifted from a logical value "1" to a logical value "0", a transistor 334 is turned off, At the same time, the signal 152 is shifted from a logical value "0" to a logical value "1" and a transistor 335 is turned on. The transistors 332 and 333 hold the signal of the terminal 158 in a logical value "1" state and the signal of the terminal 159 in a logical value "0" state.

In the above mentioned situation, the transistor 324 is held "on" and the transistor 325 is held "off". Thus, the judgment signal 158 is held in a logical value "1" state and the signal 159 is held in a logical value "0" state for a time period from when the data signal 152 is shifted from a logical value "0" to a logical value "1" and to when the data signal 152 is again shifted from a logical value "0" to a logical value "1" regardless of the logical values of the clock signals 155 and 157.

FIG. 5A and FIG. 5B are diagrams illustrating examples of waveforms of a differential data signal and a clock signal input into the judger 104.

FIG. 5A illustrates an example of a relation between the differential data signal including the data signals 152 and 153 and the clock signal 156 obtained when the reference voltage of the signal 153 is higher than that of the signal 152. A waveform 400 is a voltage waveform of the signal 152 and a waveform 402 is a voltage waveform of the signal 153. A waveform 404 is a voltage waveform of the clock signal 156. As described above, the clock signal 156 rises at a timing corresponding to a central part of two crossing points of the waveforms 400 and 402. Thus, in the case that the reference voltage of the signal 153 is higher than that of the signal 152, the time counted from a central part E between two crossing points to a crossing point F at which the signal 153 rises becomes longer than a half period of the clock signal 156. As a result, when the clock signal 156 is sampled at the crossing point at which the clock signal 153 rises, a logical value "1" is typically obtained.

FIG. 5B illustrates an example of a relation between the differential data signal including the data signals 152 and 153 and the clock signal 156 obtained when the reference voltage of the signal 152 is higher than that of the signal 153. A waveform 410 is a voltage waveform of the signal 152 and a waveform 412 is a voltage waveform of the signal 153. A waveform 414 is a voltage waveform of the clock signal 156. In the case that the reference voltage of the signal 153 is lower than that of the signal 152, the time counted from a central part G between two crossing points to a crossing point H at which the signal 153 rises becomes shorter than the half period of the clock signal 156. As a result, when the clock signal 156 is sampled at the crossing point at which the clock signal 153 rises, a logical value "0" is typically obtained.

Therefore, it may be judged that in the case that the judger 104 outputs a logical value "1", the reference voltage of the data signal 152 is higher than that of the data signal 153, and in the case that the judger 104 outputs a logical value "0", the reference voltage of the data signal 152 is lower than that of the data signal 153. In other words, it may become possible for the judger 104 to output a logical signal conforming to a lead or lag of the phase for a term that a differential data signal leads or lags in phase a clock signal at each crossing point of component data signals of the differential data signal by using the clock signal 156 or 157 which has been generated using the clock generator 102 as a reference.

FIG. 6A is a diagram illustrating an example of a configuration of an up-down counter which is a constitutional example of the detector 106 and FIG. 6B and FIG. 6C are diagrams illustrating examples of truth tables of a selector.

In FIG. 6A, a selector 500 outputs a signal 520 in accordance with the logical values of the judgment signals 158 and 159 and with reference to the truth table illustrated in FIG. 6B. In the case that the judgment signal 158 has a logical value "1", the signal 520 output from the selector 500 exhibits "+1". Incidentally, "+1" means to add the decimal number 1 to the value of a signal concerned using an adder 504 which will be described later. In reality, it is input as an n-bit binary number. On the other hand, in the case that the judgment signal 158 has a logical value "0", the signal 520 output from the selector 500 exhibits "−1". Incidentally, "−1" means to subtract the decimal number 1 from the value of a signal concerned using the adder 504. In reality, a complement of 1 is input as an n-bit binary number. As a numerical value to be input into the selector 500, a two-bit binary number may be used and it may be expanded to an n-bit binary number before it is input into the adder 504. Owing to the above mentioned operations, the circuit size of each of the selectors 500 and 502 may be reduced.

The selector 502 outputs a signal 524 in accordance with the logical values of the signals 520 and 522 and with reference to the truth table in FIG. 6C. In the case that the signal 522 has a logical value "0", the selector 502 outputs the contents of the signal 520. In the case that the signal 522 has a logical value "1", the selector 502 outputs a logical value "0".

The adder 504 adds a digital value of the signal 524 to a digital value of a signal 526 and outputs a signal 528. A register 506 outputs a count value which is held therein as a signal 160n in an n-bit form in accordance with a clock signal 530. As the clock signal 530, a signal obtained by dividing the frequencies of the clock signals 156 and 157 which are output from the clock generator 102 may be used.

A detector 508 outputs a logical value "1" in the case that all the bits output from the register 506 have "0's". A detector 510 outputs a logical value "1" in the case that all the bits output from the register 506 have "1's". An AND circuit 512 outputs a logical product of an output from the detector 508 and the signal 159. An AND circuit 514 outputs a logical product of an output from the detector 510 and the judgment signal 158. An OR circuit 516 outputs a logical sum of outputs from the AND circuits 512 and 514.

A counting-up operation to generate a value which is larger a maximum value of the count value which may be held in the register 506 and a counting-down operation to generate a value which is smaller than a minimum value of the count value which may be held in the register 506 may be avoided by inputting an output signal 522 from the OR circuit 516 into the selector 502.

Owing to the above mentioned operations, it may become possible for the detector 106 to convert a time for which a differential data signal leads or lags in phase a clock signal at a crossing point of component data signals of the differential data signal to a digital value which is called a count value. At the completion of execution of an offset adjusting process, the differential data signal leads or lags in phase the clock signal uniformly at crossing points. The values "+1" and "−1" are input into the selector 500 with the same probability and hence the count value of the detector 106 is neither incremented nor decremented. The register 506 stores the count value, so that the value of the output signal 160n from the detector 106 which is obtained at the completion of execution of the offset adjusting process is maintained constant.

FIG. 7 is a diagram illustrating an example of a timing flowchart of the detector 106 illustrated in FIG. 6.

A waveform 550 is a time waveform of the clock signal 530. "+1" or "−1" which is written under the waveform 550 is the value of the signal 520 which is output from the selector 500. A waveform 552 is a time waveform of the judgment signal 158 and a waveform 554 is a time waveform of the judgment signal 159. A waveform 556n is a time waveform of each bit of the signal 160n which is output from the register 506. In the example illustrated in FIG. 7, time waveforms of respective bits are illustrated supposing that n=3. A waveform 5563 is a waveform of the most significant bit and a waveform 5561 is a waveform of the least significant bit.

Data 558 indicates output values from the register 506 which are expressed in the form of decimal numbers. It may be seen from the data 558 that a counting-up operation to generate a value which is higher than a maximum count value "7" that the register 506 may hold is avoided.

An integrating circuit may be used as the detector 106. The integrating circuit includes a capacitive element which is disposed between signal lines along which the judgment signals 158 and 159 are propagated and the ground. The logical value which is output from the judger 104 is limited to "1" or "0" and a voltage of a value obtained in the above mentioned situation is applied to the capacitive element of the integrating circuit. Thus, the adjuster 108 is permitted to determine the reference voltage adjustment amount in accordance with the value of the voltage so applied.

Figure 8:
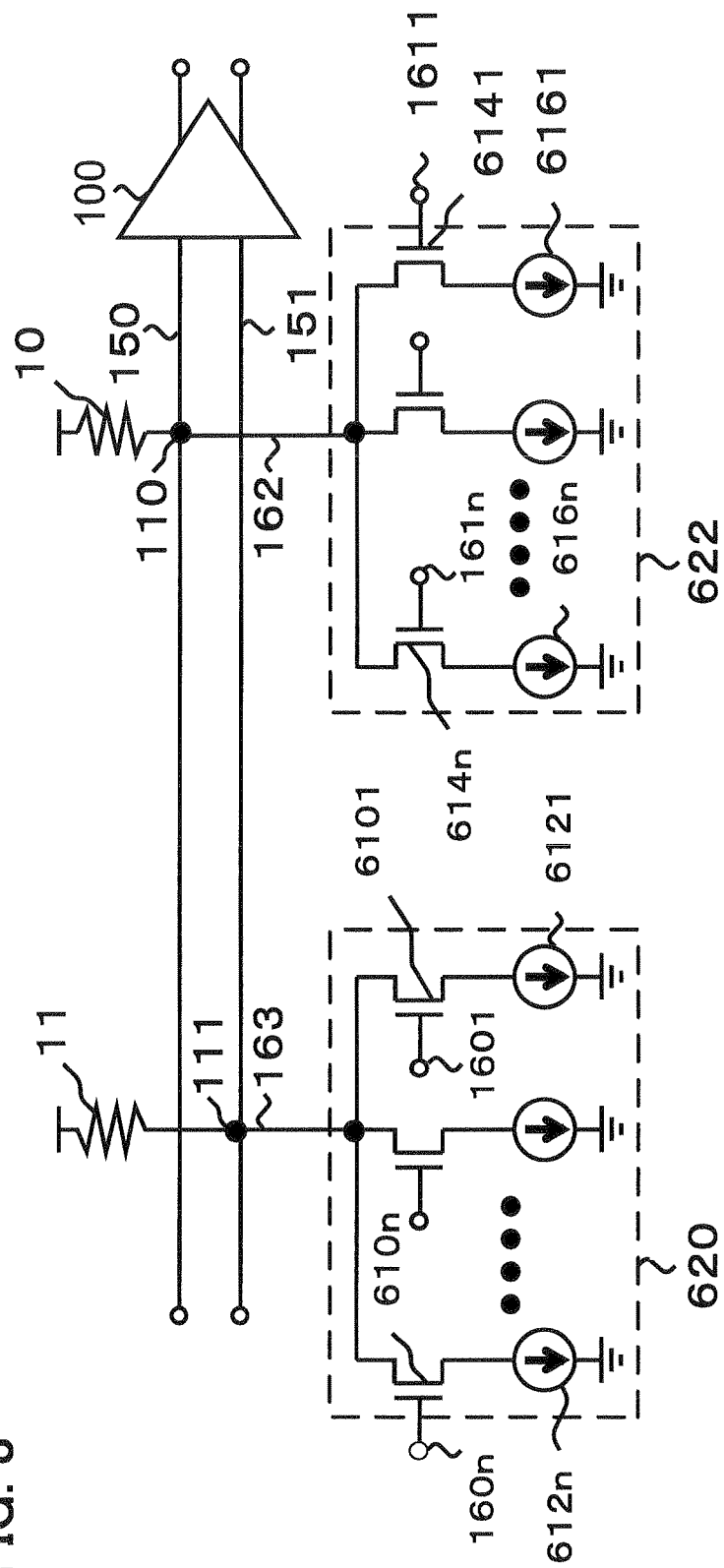
FIG. 8 is a diagram illustrating an example of a circuit diagram of an adjustor.

FIG. 8 is a diagram illustrating an example of a circuit diagram of the adjuster 108 in the case that the detector 106 illustrated in FIG. 6 is used. The same numerals are assigned to the same components as those illustrated in FIG. 1 and description thereof will be omitted. Current source groups 620 and 622 adjust the reference voltages of the data signals 150 and 151. The current source groups 620 and 622 are connected to signals lines of the data signals 150 and 151 via the connection points 110 and 111. The current source group 620 includes a plurality of current sources 6121 to 612n and MOS transistors 6101 to 610n which are respectively connected in series with the current sources 6121 to 612n. The current source group 622 includes a plurality of current sources 6161 to 616n and MOS transistors 6141 to 614n which are respectively connected in series with the current sources 6161 to 616n.

The MOS transistors 6101 to 610n are connected to the connection point 111. Each of the MOS transistors 6101 to 610n operates as a switch and is turned on/off with the signal 160n. The signal 160n is output from the detector 106 illustrated in FIG. 6.

The current sources 6121 to 612n are respectively connected in series with the MOS transistors 6101 to 610n. Therefore, the higher the count value of the detector 106 is, the more the number of current sources which are connected to the connection point 111 is increased. Then, the more the number of current sources which are connected to the connection point 111 is increased, the more the amount of current flowing from the connection point 111 to the ground is increased. As a result, the current flowing into the resistor 11 is increased, so that the voltage drop is increased and the reference voltage of the data signal 151 is decreased. Incidentally, the current value of the current source 612n may be set such that as "n" is increased, the current value is increased accordingly. For example, the current values of the respective current sources are sequentially increased by a factor of two and then by a factor of four (two by two) using the current value of the current source 6121 as a reference. Thus, in the case that the current value of the current source 6121 is 1 mA, the current sources having current values of 2 mA and 4 mA are obtained. As a result, the current amount may be increased 1 mA by 1 mA in a range from 1 mA to 7 mA by appropriately combining with one another the current sources 6121 to 612n to be connected to the connection point 111.

As the reference voltage of the data signal 151 is decreased, the reference voltage of the data signal 153 which is output from the amplifier 100 is decreased accordingly. As a result, the differential data signal leads in phase the clock signal at a crossing point of the data signals 152 and 153 and hence the count value that the detector 106 counts is decreased.

The MOS transistors 6141 to 614n are connected to the connection point 110. Each of the MOS transistors 6141 to 614n is turned on/off with a signal 161n. The signal 161n is a complement signal which is obtained by inverting each bit of the output signal 160n from the detector 106.

The current sources 6161 to 616n are respectively connected in series with the MOS transistors 6141 to 614n. Therefore, the lower the count value of the detector 106 is, the more the number of current sources 616n which are connected to the connection point 110 is increased. Then, the more the number of current sources 616n which are connected to the connection point 110 is increased, the more the amount of current flowing from the connection point 110 to the ground is increased. As a result, the current flowing into the resistor 10 is increased, so that the voltage drop is increased and the reference voltage of the data signal 150 is decreased. Incidentally, the current values of the current sources 6161 to 616n may be set such that as "n" is increased, the current value is increased accordingly as in the case with the current sources 6121 to 612n. Connection of the current sources 6161 to 616n (which current source is to be connected) is determined with the signal 161n which is a complement signal of the detection (output) signal 160n which is output from the detector 160. Thus, the more the amount of currents supplied from the current sources 6121 to 612n s increased, the more the amount of currents supplied from the current sources 6161 to 616n is decreased. As a result, it may become possible to set each changing amount in magnitude of the current values of the current sources 6121 to 612n, and 6161 to 616n so as to find an intermediate point in accordance with a change of the detection signal 160n which is output from the detector 106.

As the reference voltage of the data signal 150 is decreased, the reference voltage of the data signal 152 which is output from the amplifier 100 is decreased accordingly. Thus, the differential data signal lags in phase the clock signal at a crossing point of the data signals 152 and 153. As a result, the count value that the detector 106 counts is increased.

The count value which is stored in the register 506 of the detector 106 is settled to a specific value by repeating the above mentioned operations. As a result, it may become possible for the adjuster 108 to determine the reference voltages of the data signals 150 and 151 at the connection points 110 and 111 such that the generation frequencies of logical values of the input detection signals 160 and 161, that is, the signals which have been detected using the detector 106 are equal to each other. Incidentally, it may be desirable to make the current value of the current source 616n the same as that of the current source 612n for accurate adjustment of the reference voltages. According to the example of the above mentioned embodiment, it may become possible to change the reference voltages with no use of an analog circuit and hence accurate adjustment of the reference voltages may be possible without causing variations in the adjusting amounts of the reference voltages which would occur when the analog circuit is used.

Figures 9A, 9B, 9C:
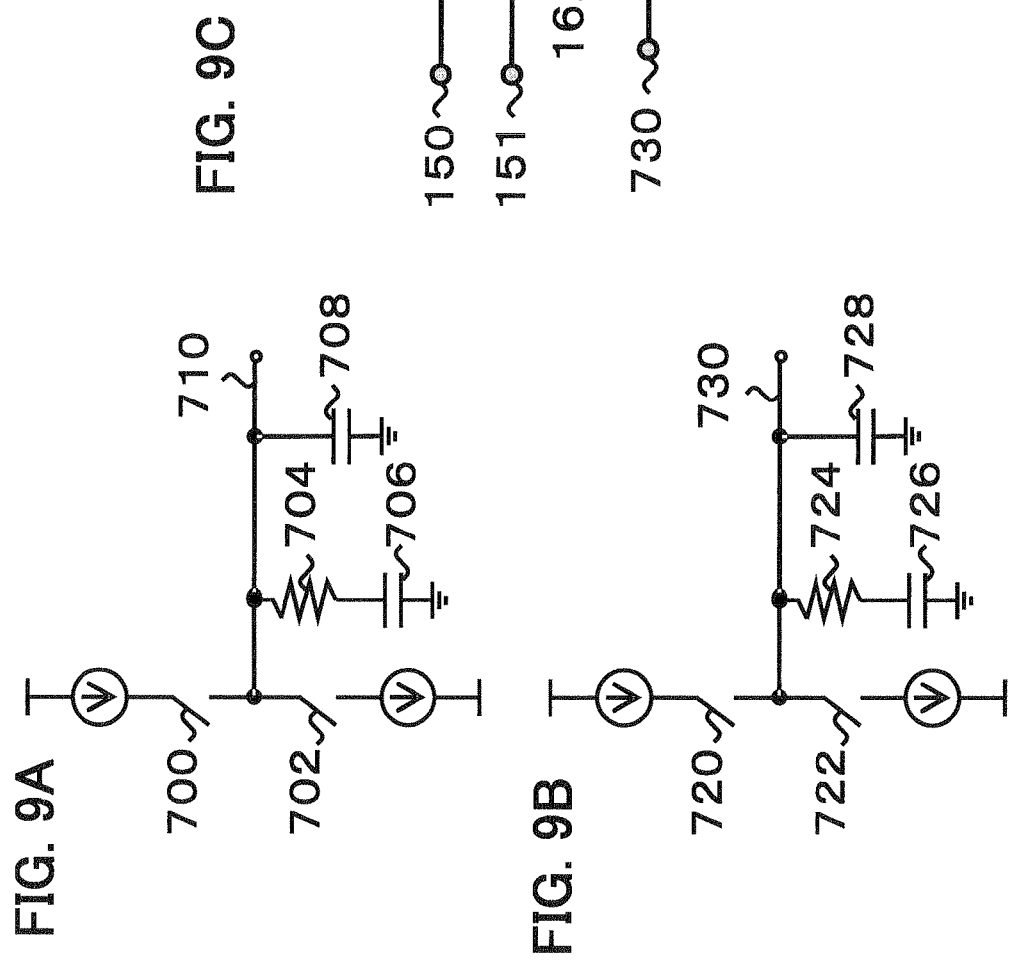
FIG. 9A is a diagram illustrating an example of a circuit diagram of an adjustor.
FIG. 9B is a diagram illustrating an example of a circuit diagram of an adjustor.
FIG. 9C is a diagram illustrating an example of a circuit diagram of an adjustor.

FIGS. 9A, 9B and 9C are diagrams illustrating examples of circuit diagrams of the adjuster 108 when an integrating circuit is used as the detector 106. FIGS. 9A and 9B illustrate examples of circuit diagrams of charge pump circuits. FIG. 9C illustrates an example of a circuit diagram of a circuit for adjusting the reference voltage of a differential data signal concerned on the basis of an output from the charge pump circuit.

In the example illustrated in FIG. 9A, a switch 700 is turned on when the logical value of the detection signal 160 which is output from the detector 106 is "1" and a switch 702 is turned on when the logical value of the detection signal 161 is "1". In addition, in the example illustrated in FIG. 9A, in the case that "1" is output as the logical value of the detection signal 160, the switch 700 is turned on and the switch 702 is turned off.

A resistive element 704 and capacitive elements 706 and 708 constitute a lag-lead filter. The lag-lead filter is configured to prevent an output signal from being phase-rotated by adding a series circuit of the resistive element and the capacitive elements to an integrating circuit. When the switch 700 is turned on, electric charges are accumulated in the capacitive elements 706 and 708 and hence the potential of a terminal 710 is increased. The resistive element 704 and the capacitive element 706 determine a cut-off frequency in a low-frequency area. Thus, the values of the resistive element 704 and the capacitive element 706 are set such that the cut-off frequency may become lower than fundamental frequencies of the detection signals 160 and 161. The cut-off frequency is expressed by 1/(R×C) wherein R is a resistance value of the resistive element and C is a capacitance value of the capacitive element.

In the example illustrated in FIG. 9B, a switch 720 is turned on when the detection signal 160 which is output from the detector 106 has a logical value "0" and a switch 722 is turned on when the detection signal 161 has a logical value "0". In the example illustrated in FIG. 9B, in the case that the detection signal 160 of a logical value "1" is output, the switch 720 is turned off and the switch 722 is turned on.

A resistive element 724 and capacitive elements 726 and 728 constitute a lag-lead filter. When the switch 722 is turned on, electric charges which are accumulated in the capacitive elements 726 and 728 are discharged and hence the potential of a terminal 730 is decreased.

In the example illustrated in FIG. 9C, the same numerals are assigned to the same members as those in FIG. 1 and description thereof will be omitted. In the case that the reference voltage of the data signal 153 is higher than that of the signal 152, the detector 106 outputs a detection signal 160 of a logical value "1". In the above mentioned situation, the potential of the terminal 710 becomes higher than that of the terminal 710 in FIG. 9A and the potential of a terminal 730 becomes lower than that of the terminal 730 in FIG. 9B. Thus, a transistor 740 is turned off and a transistor 742 is turned on. As a result, the reference voltage of the data signal 151 which is connected to the connection point 111 is decreased with the current supplied from a current source 750. The signal 153 is a signal obtained by amplifying the signal 151 using the amplifier 100. Thus, the signal 153 is adjusted such that the reference voltage thereof is decreased in accordance with adjustment of the reference voltage of the signal 151.

On the other hand, in the case that the reference voltage of the signal 152 is higher than that of the signal 153, the detector 106 outputs a signal of a logical value "0". In the above mentioned situation, the potential of the terminal 710 is decreased and the potential of the terminal 730 is increased. Thus, the transistor 740 is turned on and the transistor 742 is turned off. As a result, the reference voltage of the signal 150 flowing through the signal line which is connected to the connection point is decreased with the current supplied from the current source 750. The signal 15 is a signal obtained by amplifying the signal 150 using the amplifier 100 and hence the signal 152 is adjusted such that the reference voltage of the signal 152 is decreased in accordance with adjustment of the reference voltage of the signal 150.

The lag-lead filter may be omitted for simplification of the circuit. In the above mentioned case, a signal having the same logical value as the output signal from the detector 106 is input into the terminal and a signal obtained by logically inverting the above mentioned signal is input into the terminal 730. Owing to the above mentioned configuration, it may become possible for the adjustor 108 illustrated in FIG. 9 to perform reference voltage adjustment as favorably as the adjustor 108 illustrated in FIG. 8 into which the detector 106 illustrated in FIG. 6 is incorporated.

Figure 10:
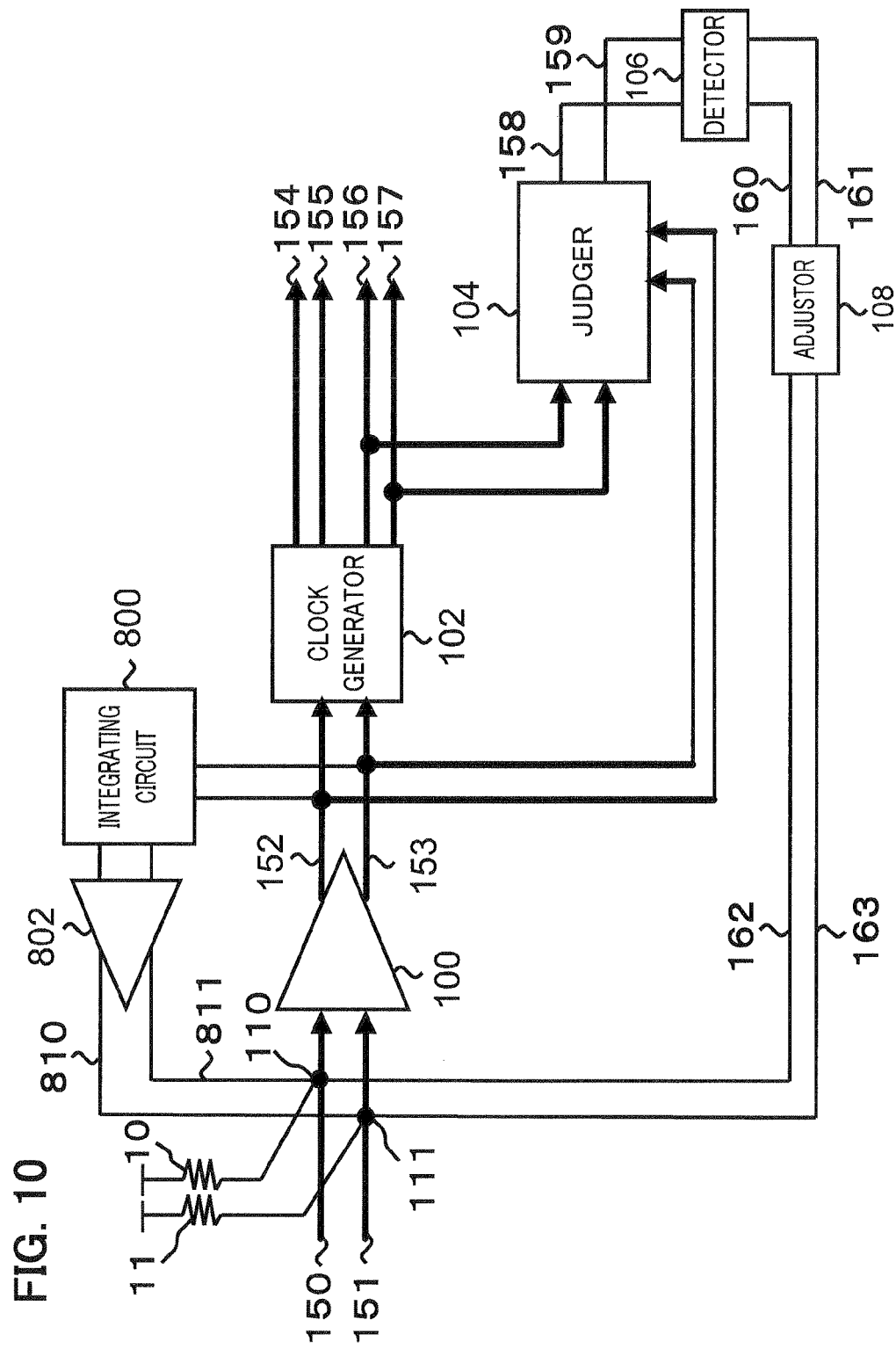
FIG. 10 is a block diagram illustrating an example of a receiver.

FIG. 10 is a block diagram illustrating an example of a configuration of a receiver configured to cope with a situation that a deviation of the reference voltage of the magnitude exceeding a signal amplitude is present in an input differential signal. The receiver illustrated in FIG. 10 has a configuration obtained by adding an integrating circuit 800 and an amplifier 802 to the configuration illustrated in the block diagram in FIG. 1. In the example illustrated in FIG. 10, the same numerals are assigned to the same components as those in FIG. 1 and description thereof will be omitted.

The integrating circuit 800 extracts mean voltages of DC component signals, that is, a positive-phase component signal and a negative-phase component signals corresponding to mean values of voltage amplitudes of a differential data signal which has been output from the amplifier 100 and outputs the mean voltages so extracted to the amplifier 802. The amplifier 802 amplifies the input mean voltages and outputs amplification signals 810 and 811 to the connection points 110 and 111. Assuming that A is a gain of the amplifier 100 and B is a gain of the amplifier 802, the deviation of the reference voltage will be compressed to 1/(1+A×B).

In the case that a deviation of the reference voltage of the magnitude exceeding the signal amplitude is present in an input differential data signal, a crossing point at which a positive-phase component signal and a negative-phase component signal intersect each other is not present. Therefore, the reference voltage may not be adjusted using the circuit illustrated in FIG. 1. By using the above mentioned configuration, the gains A and B of operational amplifiers are set so as to generate a crossing point in the waveform of the differential data signal. Owing to the above mentioned arrangement, the deviation of the reference voltage may be reduced so as to generate the crossing point in the waveform of the differential data signal even when the deviation of the reference voltage of the magnitude exceeding the signal amplitude is present in the input differential data signal. In addition, it may become possible to perform a reference voltage adjusting operation which is designed to reduce the variations in reference voltage adjusting amounts which would occur when an analog circuit is used.

Incidentally, a combination of configurations according to the respective embodiments is included in the embodiments of the present invention.

What is claimed is:
1. A receiver comprising:
 a first amplifier for amplifying an input differential data signal and outputting an output differential data signal;

a clock generator for generating a differential clock signal corresponding to a period of the output differential data signal on the basis of a first positive-phase component signal and a first negative-phase component signal of the output differential data signal;

a judger for outputting a first logical value or a second logical value as a judgment signal in accordance with a phase lead or phase lag which has been occurred at a crossing point of the first positive-phase component signal and the first negative-phase component signal upon rising or falling of the differential clock signal;

a detector for measuring periodically in a fixed period comprising a first period for which the judgment signal has the first logical value and a second period for which time the judgment signal has the second logical value and outputting a different value between the first period and the second period as detection signal; and an adjustor for adjusting each reference voltage of a second positive-phase component signal of the input differential data signal and a second negative-phase component signal of the input differential data signal in accordance with the detection signal.

2. The receiver according to claim 1, wherein the judger executes sampling on the differential clock signal using the output differential data signal and outputs a result of execution of sampling as the judgment signal.

3. The receiver according to claim 1, wherein the detector executes a counting-up operation when the judgment signal has the first logical value, executes a counting-down operation when the judgment signal has the second logical value, and outputs a count value counted in each fixed period as the detection signal.

4. The receiver of claims 1, wherein the adjustor comprises:

a first current source group having a plurality of first current sources;

a plurality of first switches respectively connected in series with the plurality of first current sources;

a second current source group having a plurality of second current sources; and a plurality of second switches respectively connected in series with the plurality of second current sources, wherein the first current source group is connected with a positive-phase signal line for transferring the second positive-phase component signal, the second current source group is electrically connected with a negative-phase signal line for transferring the second negative-phase component signal, and the adjustor controls the plurality of first switches in accordance with the detection signal and controls the plurality of second switches in accordance with a complement of the detection signal.

5. The receiver according to claim 4, wherein the plurality of first current sources include three current sources, and a current value of one of the current sources is used as a reference value and other current sources have current values which are respectively two times and four times as large as the reference value.

6. The receiver of claims 1, wherein the adjustor comprises:

a current source connected between a positive-phase signal line for transferring the second positive-phase component signal and a negative-phase signal line for transferring the second negative-phase component signal;

a first switch interposed between the positive-phase signal line and the current source; and a second switch interposed between the negative-phase signal line and the current source, wherein the adjustor changes an ON-resistance value of the first switch in accordance with a voltage amplitude of the detection signal and changes an ON-resistance value of the second switch in accordance with a voltage amplitude of an inverted signal of the detection signal.

7. The receiver of claims 1, further comprising:

an integrating circuit for outputting an average voltage value of voltages of the positive-phase component signal of the output differential data signal and an average voltage value of voltages of the positive-phase component signal of the input differential data signal; and a second amplifier for amplifying the average voltage value of the voltages of the first positive-phase component signal and adding the amplified average voltage value to a reference voltage of the second positive-phase component signal, and amplifying the average voltage value of the voltages of the first negative-phase component signal and adding the amplified average voltage value to a reference voltage of the second negative-phase component signal.

* * * * *